(12) United States Patent
Mikhael et al.

(10) Patent No.: US 7,557,019 B2
(45) Date of Patent: *Jul. 7, 2009

(54) ELECTROMAGNETIC TREATMENT IN ATMOSPHERIC-PLASMA COATING PROCESS

(75) Inventors: Michael G. Mikhael, Tucson, AZ (US);
Angelo Yializis, Tucson, AZ (US);
Richard E. Ellwanger, Tucson, AZ (US)

(73) Assignee: Sigma Laboratories of Arizona, LLC, Tucson, AZ (US)

( * ) Notice: Subject to any disclaimer, the term of this patent is extended or adjusted under 35 U.S.C. 154(b) by 276 days.

This patent is subject to a terminal disclaimer.

(21) Appl. No.: 11/633,995

(22) Filed: Dec. 5, 2006

(65) Prior Publication Data

US 2007/0093076 A1    Apr. 26, 2007

Related U.S. Application Data

(63) Continuation-in-part of application No. 11/448,966, filed on Jun. 7, 2006, now Pat. No. 7,300,859, which is a continuation-in-part of application No. 10/883,167, filed on Jul. 1, 2004, now Pat. No. 7,067,405, which is a continuation-in-part of application No. 10/228,358, filed on Aug. 26, 2002, now Pat. No. 6,774,018, which is a continuation-in-part of application No. 09/660,003, filed on Sep. 12, 2000, now Pat. No. 6,441,553, which is a continuation-in-part of application No. 09/241,882, filed on Feb. 1, 1999, now Pat. No. 6,118,218.

(51) Int. Cl.
*H01L 21/20* (2006.01)

(52) U.S. Cl. .................. 438/485; 438/99; 438/479; 438/513; 438/710; 257/E21.094

(58) Field of Classification Search ............... 438/99, 438/479, 485, 513, 710
See application file for complete search history.

(56) References Cited

U.S. PATENT DOCUMENTS

| 5,021,072 | A | * | 6/1991 | Atkins et al. ............... 65/423 |
| 5,968,377 | A | | 10/1999 | Yuasa et al. |
| 6,060,453 | A | | 5/2000 | Thomson et al. |
| 6,774,018 | B2 | | 8/2004 | Mikhael et al. |
| 7,300,859 | B2 | * | 11/2007 | Mikhael et al. ............. 438/503 |

FOREIGN PATENT DOCUMENTS

| JP | 60111176 | * | 6/1985 |
| SU | 1022672 | * | 6/1983 |

* cited by examiner

*Primary Examiner*—Wai-Sing Louie
(74) *Attorney, Agent, or Firm*—Antonio R. Durando

(57) ABSTRACT

A plasma is produced in a treatment space (58) by diffusing a plasma gas at atmospheric pressure and subjecting it to an electric field created by two metallic electrodes (54,56) separated by a dielectric material (64), and a precursor material is introduced into the treatment space to coat a substrate film or web (14) by vapor deposition or atomized spraying at atmospheric pressure. The deposited precursor exposed to an electromagnetic field (AC, DC, or plasma) and then it is cured by electron-beam, infrared-light, visible-light, or ultraviolet-light radiation, as most appropriate for the particular material being deposited. Additional plasma post-treatment may be used to enhance the properties of the resulting coated products.

15 Claims, 7 Drawing Sheets

ELECTROMAGNETIC TREATMENT IN ATMOSPHERIC-PLASMA COATING PROCESS

RELATED APPLICATIONS

This application is a continuation-in-part of U.S. Ser. No. 11/448,966, filed on Jun. 7, 2006 (issued as U.S. Pat. No. 7,300,859), which is a continuation-in-part of U.S. Ser. No. 10/883,167, filed on Jul. 1, 2004 (issued as U.S. Pat. No. 7,067,405), which is a continuation-in-part of U.S. Ser. No. 10/228,358, filed on Aug. 26, 2002 (issued as U.S. Pat. No. 6,774,018), which is a continuation-in-part of Ser. No. 09/660,003, filed on Sep. 12, 2000 (issued as U.S. Pat. No. 6,441,553), which is a continuation-in-part of Ser. No. 09/241,882, filed on Feb. 1, 1999 (issued as U.S. Pat. No. 6,118,218).

BACKGROUND OF THE INVENTION

1. Field of the Invention

This invention relates generally to atmospheric glow-discharge plasma treatment and precursor deposition with various curing steps and/or post-deposition treatments tailored to optimize the end result for specific applications. In particular, the invention is related to the treatment of the deposited precursor layer prior to curing.

2. Description of the Related Art

It is known that atmospheric plasma can be generated at relatively low temperatures with a proper power source, the insertion of a dielectric layer between the electrodes, and the use of an appropriate gas mixture as the plasma medium. For surface treatment of polymer films, fabrics, paper, etc., atmospheric plasma can be established between two electrodes using an inert gas such as helium under particular operating conditions. Usually one electrode is attached to a high voltage power supply and the other electrode consists of a grounded rotating drum. One electrode is coated with a ceramic layer and the plasma gas is injected between the electrodes. Examples of such glow-discharge plasma systems operating at atmospheric pressure are described in U.S. Pat. Nos. 5,387,842, 5,403,453, 5,414,324, 5,456,972, 5,558,843, 5,669,583, 5,714,308, 5,767,469, and 5,789,145.

U.S. Pat. No. 6,118,218, incorporated herein by reference, disclosed a plasma treatment system capable of producing a steady glow discharge at atmospheric pressure with a variety of gas mixtures operating at frequencies as low as 60 Hz. That invention involves incorporating a porous metallic layer in one of the electrodes of a conventional plasma treatment system. A plasma gas is injected into the electrode at substantially atmospheric pressure and allowed to diffuse through the porous layer, thereby forming a uniform glow-discharge plasma. As in prior-art processes, the material to be treated is exposed to the plasma created between this electrode and a second electrode covered by a dielectric layer.

U.S. Pat. No. 6,441,553, hereby incorporated by reference, disclosed an improvement as a result of the discovery that the electrodes of U.S. Pat. No. 6,118,218 could be used in conjunction with novel electrode arrangements to overcome the substrate-thickness limitations imposed by conventional plasma-treatment apparatus. By eliminating the need to maintain an electric field across the substrate being treated, the electrode assembly of the invention makes it possible to treat thick substrates and substrates of metallic composition that could not be treated with prior-art equipment. In addition, a powdery substrate can be treated by adding a shaker to a belt used to convey the substrate through the plasma field.

U.S. Pat. No. 6,441,553, hereby incorporated by reference, disclosed an atmospheric vapor deposition process carried out in combination with atmospheric plasma treatment. The substance of interest is vaporized, mixed with the plasma gas, and diffused through a porous electrode. A heater is provided to maintain, if necessary, the temperature of the electrode above the condensation temperature of the substance in order to prevent deposition during diffusion. Thus, plasma treatment and vapor deposition are carried out on a target substrate at the same time at atmospheric pressure.

U.S. Pat. No. 6,441,553, hereby incorporated by reference, describes the combination of vapor deposition and plasma treatment at atmospheric pressure using certain classes of evaporable liquid and solid materials to produce films and coatings with specifically improved barrier properties. Inasmuch as similar coatings have been produced using vapor deposition and plasma treatment under vacuum, many useful gases (i.e., vapors at ambient conditions) and vaporizable constituents are known from the prior art that can also be used advantageously in the atmospheric-pressure process of the invention (such materials are typically referred to as "precursors" in the art).

U.S. Pat. No. 6,774,018, hereby also incorporated by reference, provides a further development in the art of using atmospheric-plasma treatment to improve conventional deposition and surface treatment processes. A plasma gas at atmospheric pressure is used with various vapor precursors, such as silicon-based materials, fluorine-based materials, chlorine-based materials, and organo-metallic complex materials, to enable the manufacture of coated substrates with improved properties with regard to moisture-barrier, oxygen-barrier, hardness, scratch- and abrasion-resistance, chemical-resistance, low-friction, hydrophobic and/or oleophobic, hydrophilic, biocide and/or antibacterial, and electrostatic-dissipative/conductive characteristics.

Finally, U.S. Pat. No. 7,067,405 and U.S. Ser. No. 11/448,966, both incorporated herein by this reference, disclosed various atmospheric techniques wherein plasma treatment is combined with precursor deposition and other process steps common in the art, such as curing with ultraviolet, visible, or infrared light, electron-beam radiation, and pre- and/or post-deposition plasma treatment, to further improve the final product. The present invention represent a further step forward to that end.

BRIEF SUMMARY OF THE INVENTION

The invention is directed at atmospheric-pressure processes for films and sheets (coating layers, in general) with improved barrier properties to moisture and oxygen for use in packaging, medical applications, displays and electronic applications wherein the process of manufacture includes curing a deposited precursor layer by exposure to UV light, or visible light, infrared light, electron-beam radiation, and further by atmospheric plasma pre-treatment. The invention lies simply in the discovery that, in addition to the process steps described in the referenced patents and patent application, several advantages may be gained by also exposing the deposited layer of precursor to an electromagnetic field prior to curing.

Therefore, the preferred embodiment of the invention consists of producing an atmospheric plasma and pre-treating a substrate in the plasma field to clean its surface; coating the substrate by vapor deposition of a precursor material at atmospheric pressure during or immediately past the exposure to the plasma field; exposing the deposited layer of precursor material to an electromagnetic field; and curing the precursor so deposited by exposure to ultraviolet light in the presence of a photoinitiator.

In a second embodiment of the invention, the deposited layer is cured by exposure to visible light in the presence of a photoinitiator. In another embodiment, the precursor film formed by vapor deposition is cured with an electron beam. In yet another embodiment, the curing stage is accomplished with an infrared light. In all cases, the curing step may be followed by further plasma treatment to enhance curing and to smooth the coated surface.

According to another aspect of the invention, the precursor is atomized and sprayed over the substrate at atmospheric pressure (rather than vapor deposited) either during or immediately after exposure to the pre-treatment plasma field. Various precursors so deposited are then exposed to an electromagnetic field according to the invention, and alternatively cured using UV light, IR light, visible light, or an electron-beam gun, depending on the desired finished properties, as in the case of vapor deposited precursors. Plasma post-treatment may also be used in cases where additional curing and/or smoothing of the coated surface may be desirable.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose only some of the various ways in which the invention may be practiced.

DESCRIPTION OF THE PREFERRED
EMBODIMENTS OF THE INVENTION

This invention adds (or substitutes) a single step to the processes described in U.S. Ser. No. 11/448,966 and U.S. Pat. No. 7,067,405 to further improve the surface properties of coated substrates manufactured by plasma-enhanced vapor deposition at atmospheric pressure. Accordingly, the invention may be carried out using the various embodiments of the apparatus described in those and related disclosures, which are herein incorporated by reference in their entirety.

Figure 1:
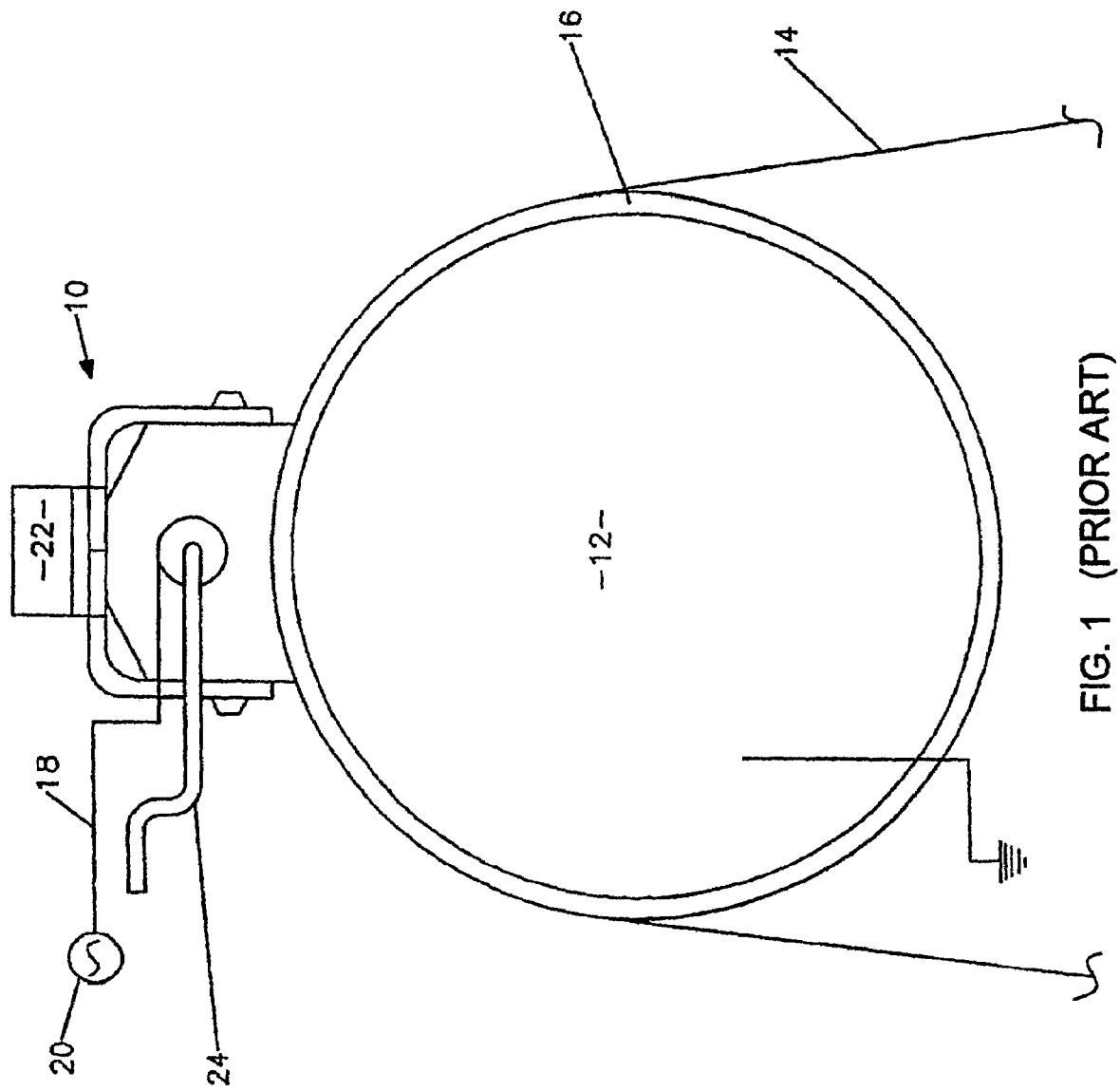
FIG. 1 is a schematic representation of a conventional plasma-treater configuration.

Referring to the drawings, wherein like parts are designated throughout with like numerals and symbols, FIG. 1 shows a general layout of an atmospheric plasma treater assembly wherein a plasma treater 10 is shown mounted opposite to the roller 12 of a conventional web-treatment system. A web or film 14 of material to be treated is passed through the assembly between the plasma treater and the roller at speeds typically ranging from 1 to 200 meter/min. The roller 12 is grounded and coated with a dielectric material 16, such as polyethylene teraphthalate (PET). The plasma treater 10 contains at least one electrode as described in U.S. Pat. No. 6,118,218, which is connected, through a cable 18, to an AC power supply 20 operating at any frequency between 60 Hz and the maximum frequency available from the power supply. The treater 10 is held in place conventionally by a holding bracket 22 to maintain a distance of 1-2 mm between the dielectric layer 16 and the treater 10. Plasma gas, such as helium, argon, and mixtures of an inert gas with nitrogen, oxygen, air, carbon dioxide, methane, acetylene, propane, ammonia, alkyl silanes, siloxanes, fluorocarbons, or mixtures thereof, can be used with this treater to sustain a uniform and steady plasma at atmospheric pressure. The gas is supplied to the treater 10 through a manifold 24 that feeds the porous electrode of the invention.

Figure 2:
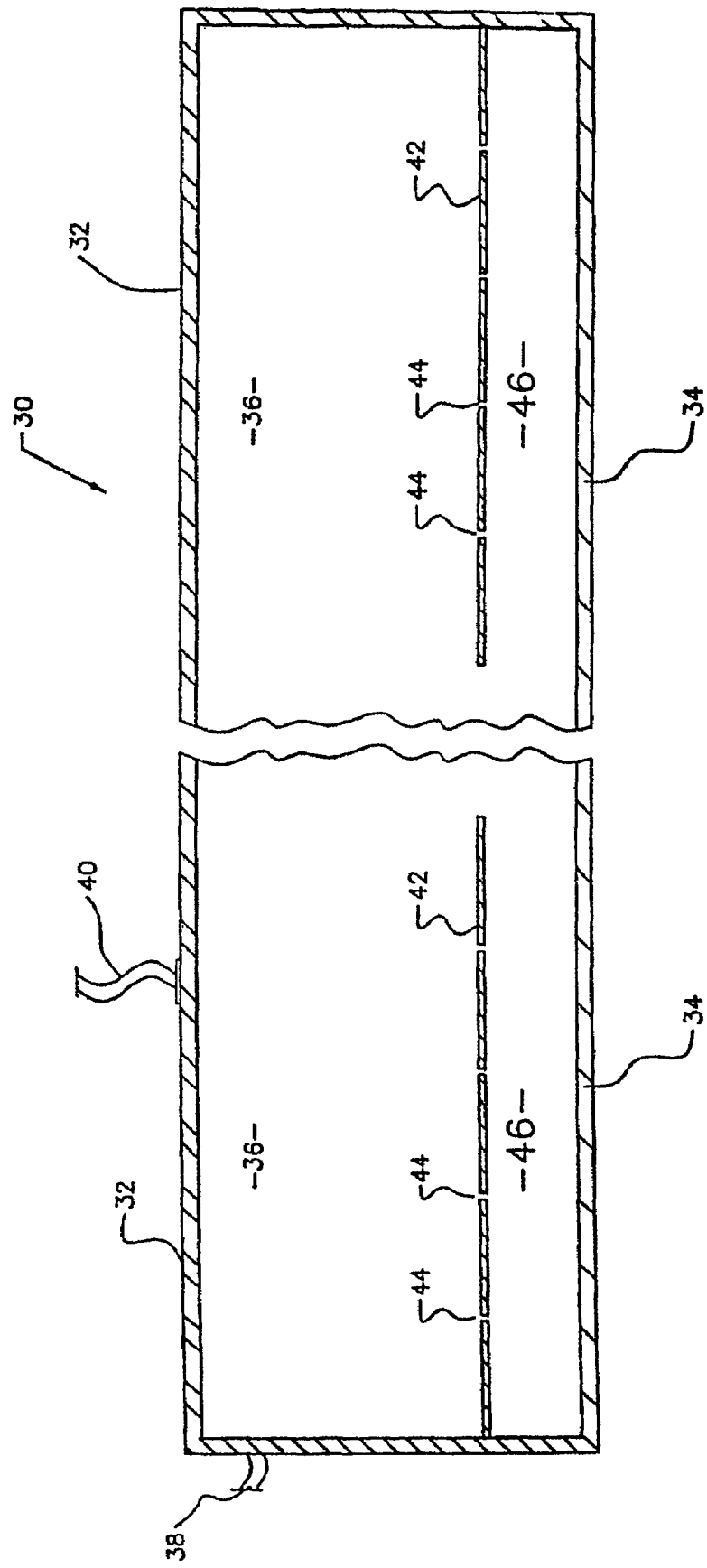
FIG. 2 is a partially cut-out, side sectional view of an electrode containing a porous-metal component according to the invention.

As shown in FIG. 2, a porous electrode 30 incorporated within the treater 10 may consist of a hollow housing 32 with a porous metal layer 34 having pores sized to approximate the mean free path of the plasma gas intended to be used in the treater. The gas is fed to the upper portion 36 of the hollow electrode 30 at substantially atmospheric pressure through an inlet pipe 38 connected to the exterior manifold 24. The electrode is energized by an electrical wire 40 connected to the power system through the exterior cable 18. The electrode 30 preferably includes a distribution baffle 42 containing multiple, uniformly spaced apertures 44 designed to distribute the gas uniformly throughout the length of the bottom portion 46 of the hollow electrode 30.

In the alternative, any one of several side-by-side embodiments of porous electrode can be used to practice the invention, as disclosed in U.S. Pat. No. 6,441,553 and exemplified herein in FIG. 3. Such an electrode unit 50 may consist, for example, of a pair of electrodes encased in a dielectric housing 52, such as a ceramic structure. A first, conventional electrode 54 is coupled to a porous electrode 56 made of the same type of porous material described in U.S. Pat. No. 6,118,218. The two electrodes are placed side by side facing the process space or zone 58 where the target substrate is intended to be treated. The electrode assembly 50 is energized by an AC power source 20 and grounded through a ground 60 in conventional manner using either electrode as the ground. An inlet port 62 is connected to the porous electrode 56 to feed the plasma gas to the unit 50 through the porous metal constituting the electrode. The dielectric housing 52 between the porous electrode 56 and the boundary of the process space 58 may also include a dielectric layer 64 that consists of a porous portion capable of diffusing plasma gas received from the porous electrode into the process space. Alternatively, the porous dielectric layer 64 may be used with a hollow electrode (instead of a porous electrode 56) for diffusing the plasma gas into the process space 58.

As a result of this configuration, an electric field is produced across the process space 58 when the electrode pair 54,56 is energized in conventional manner. The plasma gas is diffused at substantially atmospheric pressure through the porous electrode 56 and the dielectric layer 64 (or a hollow electrode and a porous dielectric layer 64) into the process space 58 where the electric field produces a steady-state glow-discharge plasma at power frequencies as low as 60 Hz. For best results, the sides 66 and 68 of the two electrodes facing the process space are substantially aligned with the exposed surface 70 of the porous dielectric layer 64, thereby promoting coupling of the two electrodes and producing an electric field across the process space along a plane aligned with the sides 66,68. Using this side-by-side embodiment of the invention, the treatment space 58 can be expanded without limitations imposed by the need to establish an electric field between the electrode and a grounded roller 12, as was the case prior to the invention disclosed in Ser. No. 09/660,003.

Figure 4:
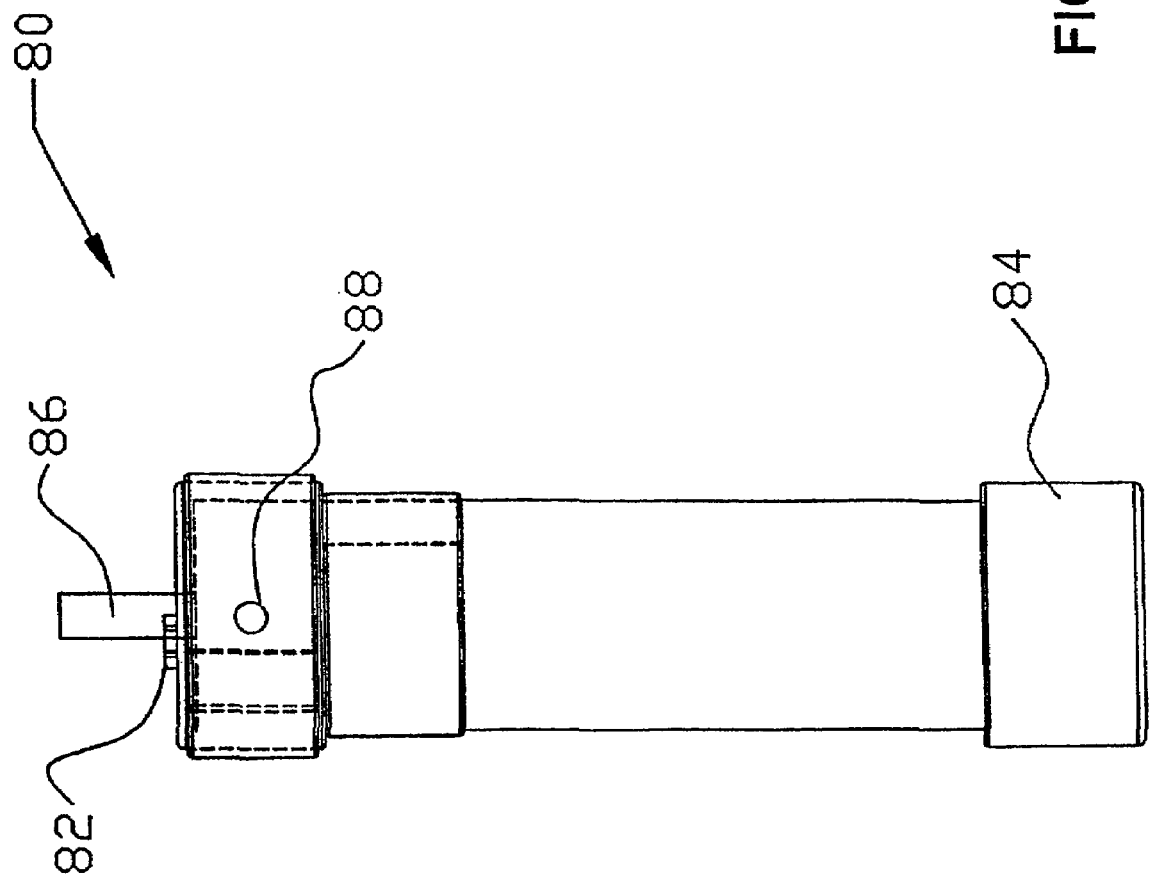
FIG. 4 is a schematic view of an evaporator used to practice the combined vapor-deposition and plasma-treatment processes of the invention at atmospheric pressure.

In order to practice the present invention, the treater assembly of FIG. 1 is preferably coupled to an evaporator 80, such as illustrated separately in FIG. 4, in order to provide the capability of evaporating liquid and solid precursors. The coating precursor to be deposited by vapor deposition on a given substrate is fed to the evaporator 80 through an inlet port 82 and is heated to its evaporation temperature by heating bands 84 at the bottom of the evaporator. If a gaseous precursor is being used, it passes through the unit without effect (or it may be passed through a bypass channel and injected directly into the treatment area). If a solid precursor is being used, it is liquefied prior to feeding it to the evaporator 80. Plasma gas is also supplied to the evaporator through a separate port 86 and is mixed with the gas or vaporized material prior to being fed to the electrode (30, 50 or equivalent porous electrode) through an outlet duct 88.

Figure 3:
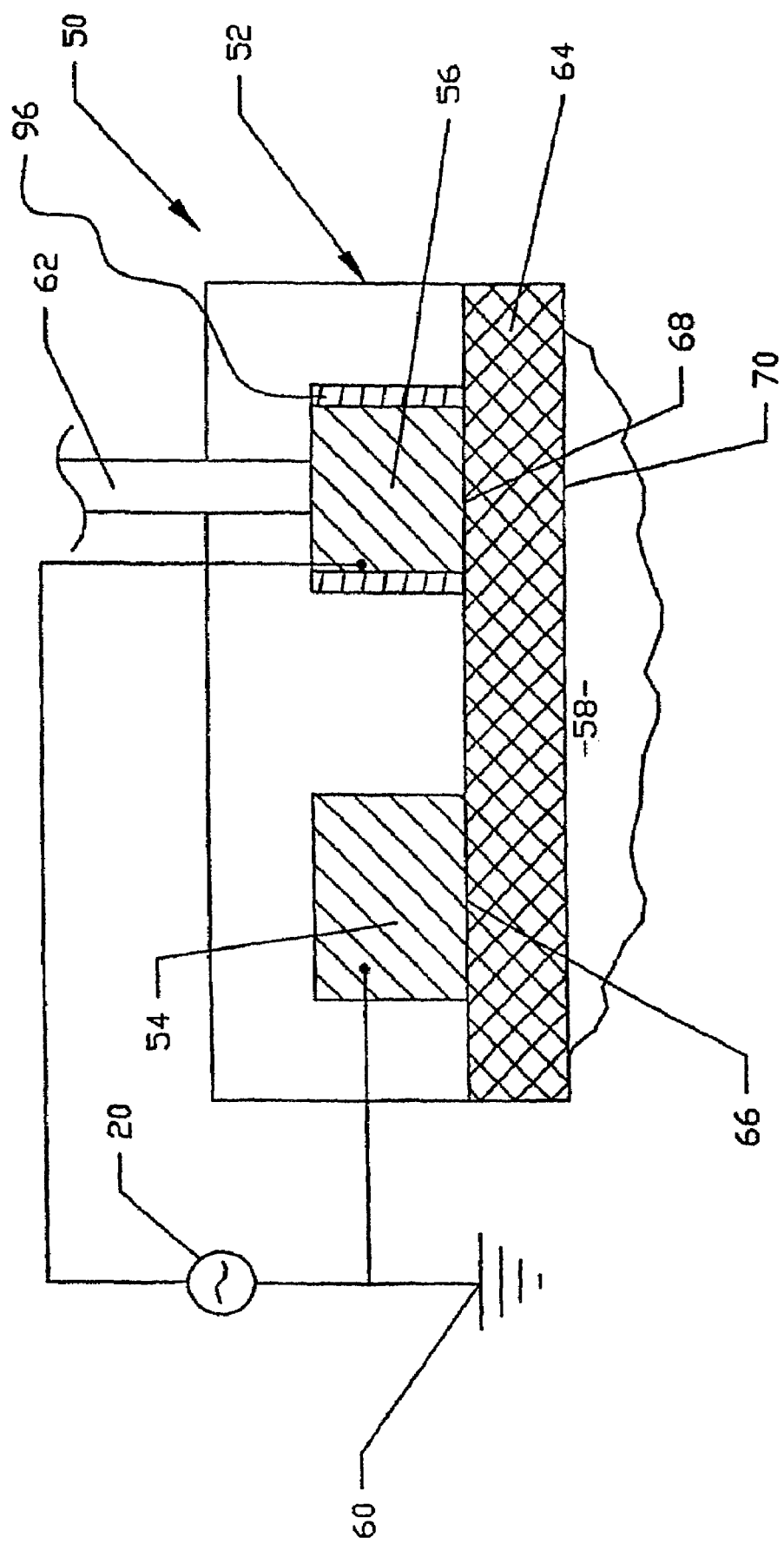
FIG. 3 is a schematic representation of an electrode assembly according to the invention wherein a porous-metal structure is used as an electrode as well as a perfusion medium in side-by-side combination with a conventional electrode encased in a dielectric medium.

As illustrated schematically with reference to the embodiment 50 of FIG. 3, a heater element 96 may also be used around the porous electrode to maintain the vaporized state of any liquid or solid precursor used in the process while the gas/vapor mixture is diffused through the porous electrode 56 (or equivalent electrode). As would be clear to one skilled in the art, the heater 96 must be capable of maintaining the electrode temperature uniformly above the vaporization temperature of the deposition material at atmospheric pressure. A temperature range from 70° C. to 100° C. has been found to be sufficient for most materials of interest. It is noted that the use of a side-by-side electrode enables plasma treatment without a dielectric coating 16 over the drum 12.

Figure 5:
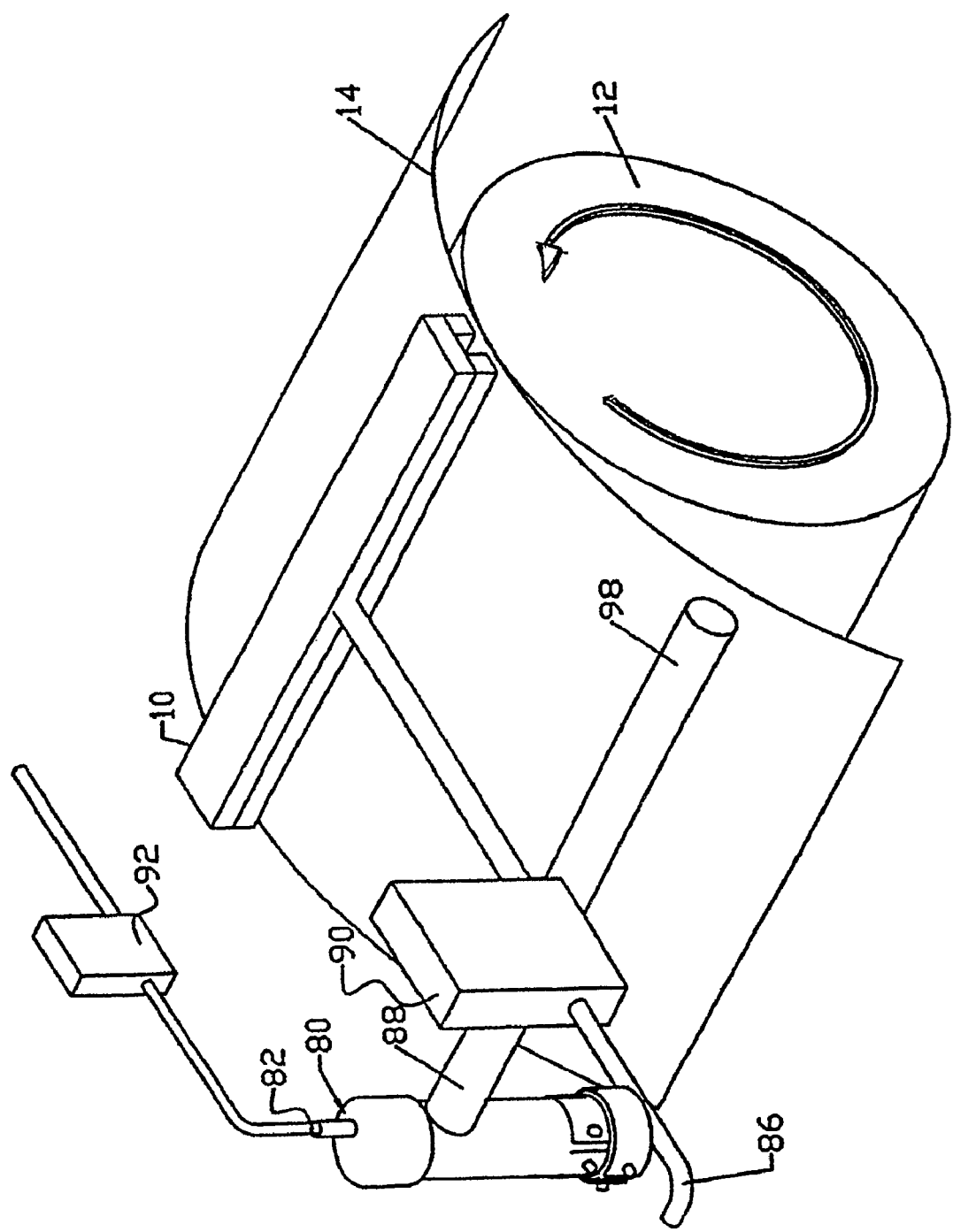
FIG. 5 is a schematic view of the plasma treater configuration of FIG. 1 incorporating the evaporator of FIG. 4 for atmospheric treatment according to the invention by injecting the coating precursor directly over the substrate immediately after its plasma treatment.

In the preferred embodiment of the invention, the evaporator 80 is used to evaporate the precursor material, if necessary, separately from the plasma gas. The flow rate of the plasma gas is controlled by a flowmeter 90, as illustrated in FIG. 5, and the flow rate of the precursor into the evaporator 80 is regulated by a separate flowmeter 92. The evaporated material is then injected directly over the substrate in the vicinity of the plasma field after passing the substrate through the treatment space between the plasma treater 10 and the drum 12. The precursor vapor is injected through a slitted nozzle 98 placed across the web 14, such that the vapor is directed for deposition toward the web under the pre-treatment influence of the plasma field created by the treater 10. The plasma gas is injected separately through the porous electrode in the treater 10 to provide the plasma field in the process space.

According to another embodiment of the invention suitable for the deposition of liquid precursors, the precursor is atomized and sprayed onto the substrate as it passes past the plasma field. Surprisingly it has been shown that, so long as the particle size of the atomized liquid permits the formation of a liquid film of desired thickness over the substrate, the effect of the plasma field and the subsequent curing by the same methods utilized with vapor deposition produce comparable results.

The present invention contemplates an additional step that was found to enhance the quality of the deposited film prior to curing. It was discovered that exposure of the precursor layer to an electromagnetic field (AC or DC, with or without the presence of a plasma gas), provides a beneficial smoothing effect on the film that greatly improves the uniformity of the coating over the substrate. In particular, the uncured film tends to diffuse and spread more evenly over the supporting substrate, thereby yielding a more uniform and consistently resilient coating. In the case of porous materials, the uncured layer tends to diffuse to both sides of the material, such that the coating of both sides of the substrate may be achieved with a single one-side operation. This property is greatly advantageous in the production of porous materials with specific surface-property requirements.

The curing step is carried out as described in the referenced application and patents, followed, if desired, by surface post-treatment to further improve adhesion and smoothness in the finished product. Accordingly, several treatment units are combined in line in a single system 100, as illustrated schematically in FIG. 6, to afford the versatility required to tailor each deposition process to the requirements of the finished product. The system 100 comprises an atmospheric plasma/vapor-deposition unit 108, preferably in the configuration detailed in FIG. 5, to plasma pre-treat the web 14 and deposit a vaporized precursor under atmospheric conditions as detailed in U.S. Pat. Nos. 6,774,018 and 7,067,405 and in application Ser. No. 11/448,966. A precursor source 110 is used in conjunction with the plasma unit 108. After deposition, the liquid layer of precursor material is exposed to an electromagnetic field produced by a unit 112 according to the invention. The unit 112 can be any pair of electrodes energized by a DC or an AC power source operating at 5 KV to 15 KV and, in the case of alternating current, within a frequency up to 200 KHz, depending on the gap between electrodes and the materials being exposed to the plasma within the gap. A typical gap is 1-5 mm. The unit 112 may also include a source of plasma gas, thereby exposing the uncured precursor to a plasma field as well. In such case, the unit 112 may consist of a plasma treater 10 such as described for the atmospheric plasma/vapor-deposition unit 108. A curing station 114 is then used after exposure to the electromagnetic unit 112 to polymerize the precursor and form a solid film over the substrate 14. The station 114 may consist of an infrared lamp, an electron-beam unit, an ultraviolet lamp, or a visible light source. In the last two cases, an appropriate photoinitiator is added to the precursor prior to vaporization. Finally, another plasma-treatment unit 116 may be used to enhance curing and to further smooth the surface of the coating film. In another embodiment of the invention illustrated in FIG. 7, the precursor is atomized, rather than vaporized, and sprayed onto the plasma-treated surface through a nozzle 120 combined to the plasma treater 10 in the configuration of FIG. 5 (where the nozzle 120 replaces the slitted nozzle 98).

Thus, the substrate 14 is treated with a plasma gas at atmospheric conditions; it is at the same time coated with a precursor; the deposited precursor layer is exposed to an electromagnetic field according to the invention; and finally it is cured according to the most appropriate method for the particular application. An additional plasma treatment may be used after curing to complete the degree of curing and further improve the properties of the finished product.

Porous and non-porous substrates such as polypropylene, polyethylene, polyethylene teraphthalate, polyamide, polyimide, cotton, polyurethane, and fluoropolymers of various thickness were coated according to the invention using various precursor materials with desirable properties for specific objectives. For instance, polyester substrates were coated by vapor deposition in a helium plasma at atmospheric pressure using vaporized silicon-based materials (e.g., siloxanes, alkyl silanes, silazanes, and silsesquioxanes) injected past a plasma treatment area. The deposited layer of precursor was exposed to an electromagnetic field for a period of at least 0.1 seconds prior to curing. A curing step appropriate for the deposited precursor was then applied. The resulting products exhibited greater uniformity in surface thickness and overall improved flexibility (due to the uniform resilience of the coating), in addition to the particular surface properties attributable to the precursor with regard to moisture- and oxygen-barrier characteristics, hardness, scratch and abrasion resistance, chemical resistance, and low friction. The same plasma gases with fluoro-silicones and other fluorine-based precursors (e.g., fluorocarbons) yielded similar results with regard to hydrophobic and/or oleophobic properties. Chlorine-based precursors (e.g., chloro-carbons, chloro-silicones) were used to produce biocide (including antibacterial) and barrier properties; and organo-metallic complex precursors (e.g., silver, copper, boron or aluminum complex) were used to produce electrostatic, dissipative, conductive, biocidal and barrier properties.

The following examples illustrate the combination of process steps that characterize the invention. All tests reported below are representative of many more similar tests carried out over a wide range of operating conditions and combinations of materials using a helium plasma gas and a precursor in proportions varying from 10 to 98% by volume of plasma gas (about 90% plasma gas being preferred, the balance being vapor precursor). The plasma gas was fed to the treater at a rate varying from extremes of about 100 to about 10,000 sccm (standard cubic centimeters per minute); the vaporized precursor was fed at a rate of about 20 to 200 sccm. In the case of atomized precursor, it was fed into the plasma gas at a rate of about 10 to 100 ml/min (atomized) in a range of plasma gas also varying from extremes of about 100 to about 10,000 sccm. The substrate material to be treated was passed through the treatment space of a 12-inch plasma treater facing a conventional rotating drum. The electrode assembly operated with a porous component with average pore size in the range of 1-20 microns. The tests were conducted with the electrode assembly operating at frequencies ranging from about 20 KHz to about 200 KHz. Following deposition, the precursor layer was exposed to an electromagnetic field (either DC or AC), operating at 5 to 15 Kilo-Volts and 20-200 KHz (in the AC case). Similarly good results were obtained also by exposing the uncured liquid film to a plasma gas of composition similar to the pre-treatment gas. Curing followed this exposure step. The following examples are indicative of preferred ranges and conditions.

EXAMPLE 1

Figure 6:
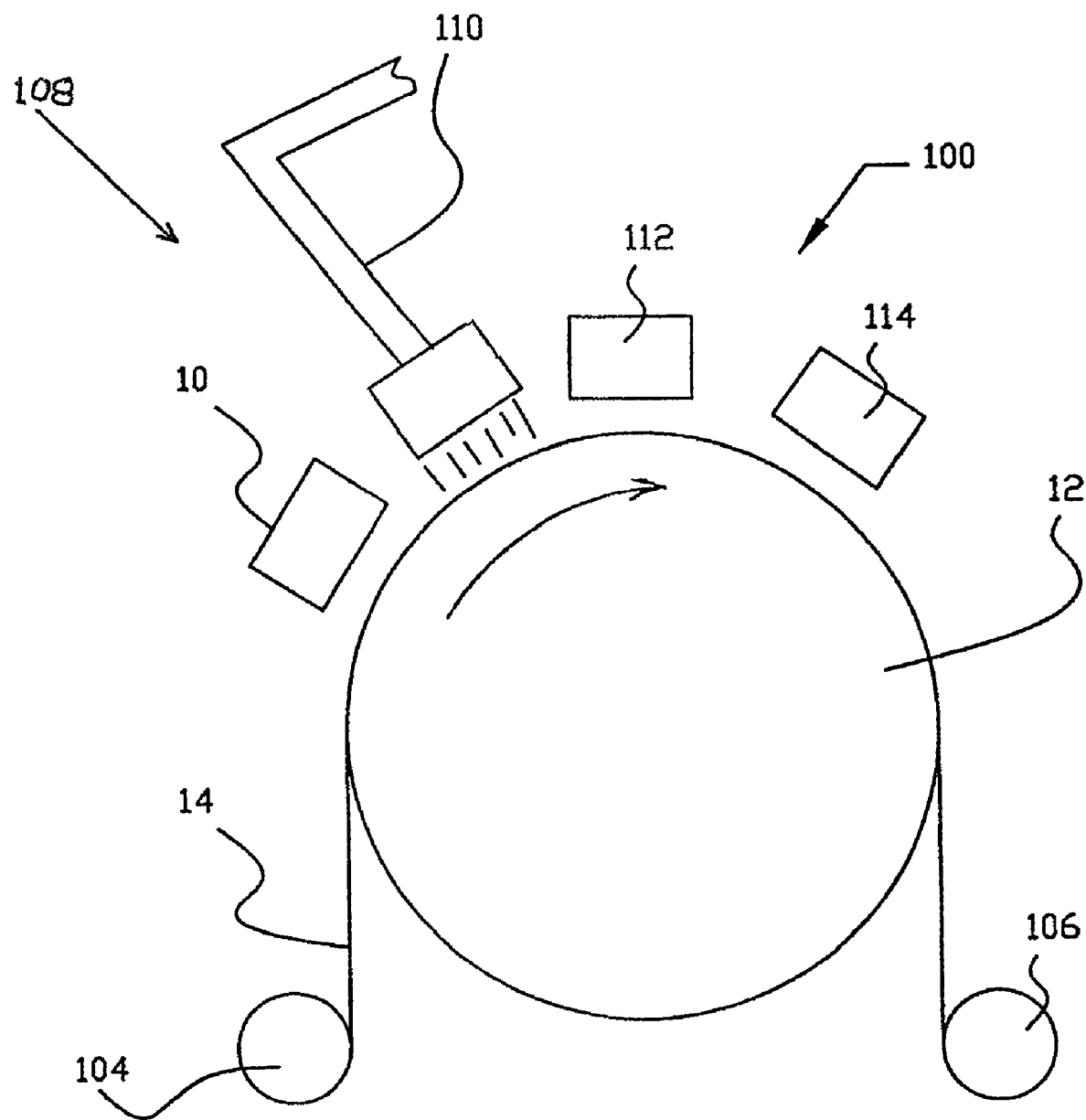
FIG. 6 is a schematic representation of an atmospheric vapor deposition system according to the invention, wherein the steps of plasma pre-treatment, vapor deposition, electromagnetic field treatment, monomer curing, and plasma post-treatment are all carried out successively in line over a moving substrate.

Atmospheric Plasma Treatment with Vapor Deposition; Electromagnetic-Field Exposure; UV-Light Curing
Substrate material: PET film run at line speed of 200 ft/min
1. Atmospheric Plasma Treatment with Vapor Deposition. An atmospheric glow discharge was produced on the substrate by feeding helium at 2000 sccm and an AC field produced at 5 KV and 20 KHz. Liquid fluoroacrylate monomer (with 5% Irgacure-184 photoinitiator) was evaporated at 200-250° C. and injected at a rate of 200 ? sccm, as shown in FIG. 6.
2. Exposure to Electromagnetic Field. The deposited layer of precursor was exposed for approximately 2 seconds to an electromagnetic field produced by a pair of electrodes energized with an AC power supply operating at 5 KV and 20 KHz prior to curing.
3. Curing. The condensed vapor was subsequently exposed to a Low-Pressure Mercury UV Lamp at 300 Watt/inch.

In addition to improved hydrophobic and oleophobic properties and chemical resistance to alcohol, with excellent adhesion to the substrate provided by the precursor material, the finished product exhibited a more uniformly thick and flexible coating. Similar results were obtained when polypropylene, polyethylene, polycarbonate, polyamide, polyimide and cellulose derivative films were treated/coated according to Example 1. The improved alcohol resistance is very important for medical applications. The same experiment was repeated with paper and fabrics (woven and nonwoven). In the case of porous substrates, it was found that exposure to an electromagnetic field according to the invention also produced diffusion of the precursor through the bulk and to both sides of the substrate, thereby very advantageously eliminating the need for a two-step coating process to cover both sides. Similar hydrophobicity and oleophobicity were obtained with other precursors, such as perfluoropolyethylene glycols, perfluorovinyl monomers, and fluorinated alcohols, in addition to the more uniform precursor diffusion provided by the invention.

EXAMPLE 2

Atmospheric Plasma Treatment; Vapor Deposition; Electromagnetic-Field Exposure; UV-Light Curing
Substrate material: PET film run at line speed of 200 ft/min
1. Atmospheric Plasma Treatment with Vapor Deposition. An atmospheric glow discharge was produced by feeding helium at 1000 sccm and an AC field operating at 10 KV and a frequency of 40 KHz. Liquid fluoroacrylate monomer (with 5% Irgacure-184 photoinitiator) was evaporated at 200-250° C. and the vapor was injected separately from the plasma gas, at a rate of 20 sccm, in the vicinity of the plasma zone, as shown in FIG. 6.
2. Exposure to Electromagnetic Field. The deposited layer of precursor was exposed for approximately 1 second to an electromagnetic field produced by a pair of electrodes energized with an AC power supply operating at 10 KV and 40 KHz prior to curing.
3. Curing. The condensed vapor was exposed to a Low-Pressure Mercury UV Lamp at 300 Watt/inch.

The resulting coated product exhibited substantially the same hydrophobic and oleophobic properties with excellent adhesion to the substrate and improved uniformity and flexibility as the product produced in Example 1. Similar results were obtained with polypropylene, polyethylene, polycarbonate, polyamide, polyimide and cellulose derivative films deposited in line immediately after plasma treatment, as illustrated in FIG. 6, using varied flow-rates and operating conditions. The same experiments were repeated with paper and fabrics (woven and nonwoven), with similar hydrophobicity and oleophobicity results. Other precursors, such as perfluoropolyethylene glycols and fluorinated alcohols, were also tested with comparable results and improved uniformity and flexibility of the polymer layer.

EXAMPLE 3

Atmospheric Plasma Treatment; Vapor Deposition, Electromagnetic-Field Exposure; Visible-Light Curing; Plasma Post-Treatment
Substrate material: PET film run at line speed of 200 ft/min
1. Atmospheric Plasma Treatment with Vapor Deposition. An atmospheric glow discharge was produced by feeding helium at 3000 sccm and an AC field operating at 5 KV and 100 KHz. Liquid fluoroacrylate monomer (with 5% H-NU-635 photoinitiator) was evaporated at 200-250° C. and the vapor was injected separately from the plasma gas, at a rate of 100 sccm, in the vicinity of the plasma zone, as shown in FIG. 6.
2. Exposure to Electromagnetic Field. The deposited layer of precursor was exposed for approximately 0.5 seconds to an electromagnetic field produced by a pair of electrodes energized with an AC power supply operating at 15 KV and 40 KHz prior to curing.
3. Curing. The condensed vapor was exposed to a Tungsten-Halogen Lamp at 100 Watt/inch.
4. Plasma Post-Treatment. The cured coating was exposed to atmospheric plasma created with helium with 5% tetrafluoromethane (fed at a combined feed rate of 3000 sccm) and an AC field produced at 5 KV and 20 KHz The resulting coated product exhibited hydrophobic and oleophobic properties with excellent adhesion to the substrate and improved uniformity and flexibility.

EXAMPLE 4

Atmospheric Plasma Treatment; Vapor Deposition; Electromagnetic-Field Exposure; Visible-Light Curing; Plasma Post-Treatment
Substrate material: PET film run at line speed of 200 ft/min
1. Atmospheric Plasma Treatment with Vapor Deposition. An atmospheric glow discharge was produced by feeding helium with 10% oxygen (by volume) at a total rate of 3000 sccm and an AC field operated at 5 KV and 20 KHz. Liquid fluoroacrylate monomer (with 5% H-NU-635 photoinitiator) was evaporated at 200-250° C. and the vapor was injected separately from the plasma gas, at a rate of 100 sccm, in the vicinity of the plasma zone, as shown in FIG. 6.
2. Exposure to Electromagnetic Field. The deposited layer of precursor was exposed for approximately 1 second to an electromagnetic field produced by a pair of electrodes energized with an AC power supply operating at 10 KV and 200 KHz prior to curing.
3. Curing. The condensed vapor was exposed to a Tungsten-Halogen Lamp at 100 Watt/inch.
4. Plasma Post-Treatment. The cured coating was exposed to atmospheric plasma created with helium with 5% tetrafluoromethane (fed at a combined feed rate of 3000 sccm) and an AC plasma field operated at 5 KV and 20 KHz.

The resulting coated product exhibited hydrophobic and oleophobic properties with excellent adhesion to the substrate. The uniformity and flexibility of the coating layer was improved.

EXAMPLE 5

Atmospheric Plasma Treatment; Vapor Deposition; Electromagnetic-Field Exposure; Visible-Light Curing; Plasma Post-Treatment
Substrate material: PET film run at line speed of 200 ft/min
1. Atmospheric Plasma Treatment with Vapor Deposition. An atmospheric glow discharge was produced by feeding helium at 3000 sccm and an AC field operated at 5 KV and 20 KHz. Liquid polyethyleneglycol monoacrylate (with 5% H-NU-635 photoinitiator) was evaporated at 200-250° C. and the vapor was injected separately from the plasma gas, at a rate of 80 sccm, in the vicinity of the plasma zone, as shown in FIG. 6.
2. Exposure to Electromagnetic Field. The deposited layer of precursor was exposed for approximately 0.1 seconds to an electromagnetic field produced by a pair of electrodes energized with an AC power supply operating at 15 KV and 200 KHz prior to curing.
3. Curing. The condensed vapor was exposed to a Tungsten-Halogen Lamp at 100 Watt/inch.
4. Plasma Post-Treatment. The cured coating was exposed to atmospheric plasma created with helium with 5% acetylene (fed at a combined feed rate of 3000 sccm) and an AC plasma field operated at 5 KV and 15 KHz The resulting coated product exhibited hydrophilic and anti-fog properties with excellent adhesion to the substrate. The uniformity and flexibility of the coating layer was improved slightly.

EXAMPLE 6

Atmospheric Plasma Treatment; Vapor Deposition; Electromagnetic-Field Exposure; Visible-Light Curing; Plasma Post-Treatment
Substrate material: PET film run at line speed of 200 ft/min
1. Atmospheric Plasma Treatment with Vapor Deposition. An atmospheric glow discharge was produced by feeding helium at 3000 sccm and an AC field operated at 5 KV and 20 KHz. Liquid acrolin and/or chlorinated acrylate (with 5% H-NU-635 photoinitiator) was evaporated at 200-250° C. and the vapor was injected separately from the plasma gas, at a rate of 80 sccm, in the vicinity of the plasma zone, as shown in FIG. 6.
2. Exposure to Electromagnetic Field. The deposited layer of precursor was exposed for approximately 1.5 seconds to an electromagnetic field produced by a pair of electrodes energized with an AC power supply operating at 5 KV and 20 KHz prior to curing.
3. Curing. The condensed vapor was exposed to a Tungsten-Halogen Lamp at 100 Watt/inch.
4. Plasma Post-Treatment. The cured coating was exposed to atmospheric plasma created with helium with 5% acetylene (fed at a combined feed rate of 3000 sccm) and an AC plasma field operated at 5 KV and 20 KHz.

The resulting coated product exhibited biocide, anti-bacterial properties with excellent adhesion to the substrate. The uniformity and flexibility of the coating layer was improved significantly.

EXAMPLE 7

Atmospheric Plasma Treatment; Vapor Deposition; Electromagnetic-Field Exposure; IR-Light Curing; Plasma Post-Treatment
Substrate material: PET film run at line speed of 20 ft/min
1. Atmospheric Plasma Treatment with Vapor Deposition. An atmospheric glow discharge was produced by feeding helium at 3000 sccm and an AC field operated at 5 KV and 20 KHz. Liquid fluoroacrylate monomer was evaporated at 200-250° C. and the vapor was injected separately from the plasma gas, at a rate of 100 sccm, in the vicinity of the plasma zone, as shown in FIG. 6.
2. Exposure to Electromagnetic Field. The deposited layer of precursor was exposed for approximately 1 second to an electromagnetic field produced by a pair of electrodes energized with an AC power supply operating at 5 KV and 20 KHz prior to curing.
3. Curing. The condensed vapor was exposed to an Infrared Lamp at 500 Watt.
4. Plasma Post-Treatment. The cured coating was exposed to atmospheric plasma created with helium with 5% tetrafluoromethane (fed at a combined feed rate of 3000 sccm) and an AC plasma field operated at 5 KV and 20 KHz.

The resulting coated product exhibited hydrophobic and oleophobic properties with excellent adhesion to the substrate. The uniformity and flexibility of the coating layer was improved significantly.

EXAMPLE 8

Atmospheric Plasma Treatment; Vapor Deposition; Electromagnetic-Field Exposure; IR-Light Curing; Plasma Post-Treatment
Substrate material: PET film run at line speed of 20 ft/min
1. Atmospheric Plasma Treatment with Vapor Deposition. An atmospheric glow discharge was produced by feeding helium with 10% (by volume) at a total rate of 3000 sccm and an AC field operated at 5 KV and 20 KHz. Liquid fluoroacrylate monomer was evaporated at 200-250° C. and the vapor was injected separately from the plasma gas, at a rate of 200 sccm, in the vicinity of the plasma zone, as shown in FIG. 6.
2. Exposure to Electromagnetic Field. The deposited layer of precursor was exposed for approximately 2 seconds to an electromagnetic field produced by a pair of electrodes energized with an AC power supply operating at 5 KV and 20 KHz prior to curing.
3. Curing. The condensed vapor was exposed to an Infrared Lamp at 500 Watt.
4. Plasma Post-Treatment. The cured coating was exposed to atmospheric plasma created with helium with 5% tetrafluoromethane (fed at a combined feed rate of 3000 sccm) and an AC plasma field operated at 5 KV and 20 KHz.

The resulting coated product exhibited hydrophobic and oleophobic properties with excellent adhesion to the substrate. The uniformity and flexibility of the coating layer was improved significantly.

EXAMPLE 9

Atmospheric Plasma Treatment; Vapor Deposition; Electromagnetic-Field Exposure; IR-Light Curing; Plasma Post-Treatment
Substrate material: PET film run at line speed of 20 ft/min
1. Atmospheric Plasma Treatment with Vapor Deposition. An atmospheric glow discharge was produced by feeding helium at 3000 sccm and an AC field operated at 5 KV and 20 KHz. Liquid polyethyleneglycol monoacrylate was evaporated at 200-250° C. and the vapor was injected separately from the plasma gas, at a rate of 80 sccm, in the vicinity of the plasma zone, as shown in FIG. 6.
2. Exposure to Electromagnetic Field. The deposited layer of precursor was exposed for approximately 1.5 seconds to an electromagnetic field produced by a pair of electrodes energized with an AC power supply operating at 5 KV and 20 KHz prior to curing.
3. Curing. The condensed vapor was exposed to an Infrared Lamp at 500 Watt.
4. Plasma Post-Treatment. The cured coating was exposed to atmospheric plasma created with helium with 5% acetylene (fed at a combined feed rate of 3000 sccm) and an AC plasma field operated at 5 KV and 15 KHz.

The resulting coated product exhibited hydrophilic and anti-fog properties with excellent adhesion to the substrate. The uniformity and flexibility of the coating layer was improved.

EXAMPLE 10

Atmospheric Plasma Treatment; Vapor Deposition; Electromagnetic-Field Exposure; IR-Light Curing; Plasma Post-Treatment
Substrate material: PET film run at line speed of 20 ft/min
1. Atmospheric Plasma Treatment with Vapor Deposition. An atmospheric glow discharge was produced by feeding helium at 3000 sccm and an AC field operated at 5 KV and 20 KHz. Liquid acrolin and/or chlorinated acrylate was evaporated at 200-250° C. and the vapor was injected separately from the plasma gas, at a rate of 200 sccm, in the vicinity of the plasma zone, as shown in FIG. 6.
2. Exposure to Electromagnetic Field. The deposited layer of precursor was exposed for approximately 1 seconds to an electromagnetic field produced by a pair of electrodes energized with an AC power supply operating at 5 KV and 20 KHz prior to curing.
3. Curing. The condensed vapor was exposed to an Infrared Lamp at 500 Watt.
4. Plasma Post-Treatment. The cured coating was exposed to atmospheric plasma created with helium with 5% acetylene (fed at a combined feed rate of 3000 sccm) and an AC plasma field operated at 5 KV and 20 KHz.

The resulting coated product exhibited biocide, anti-bacterial properties with excellent adhesion to the substrate. The uniformity and flexibility of the coating layer was improved.

EXAMPLE 11

Atmospheric Plasma Treatment; Vapor Deposition; Electromagnetic-Field Exposure; Electron-Beam Curing; Plasma Post-Treatment
Substrate material: PET film run at line speed of 200 ft/min
1. Atmospheric Plasma Treatment with Vapor Deposition. An atmospheric glow discharge was produced by feeding helium at 3000 sccm and an AC field operated at 5 KV and 20 KHz. Liquid fluoroacrylate monomer was evaporated at 200-250° C. and the vapor was injected separately from the plasma gas, at a rate of 200 sccm, in the vicinity of the plasma zone, as shown in FIG. 6.
2. Exposure to Electromagnetic Field. The deposited layer of precursor was exposed for approximately 1 second to an electromagnetic field produced by a pair of electrodes energized with an AC power supply operating at 5 KV and 20 KHz prior to curing.
3. Curing. The condensed vapor was exposed to an Electrocurtain (Energy Science, Inc.).
4. Plasma Post-Treatment. The cured coating was exposed to atmospheric plasma created with helium with 5% tetrafluoromethane (fed at a combined feed rate of 3000 sccm) and an AC plasma field operated at 5 KV and 15 KHz.

The resulting coated product exhibited hydrophobic and oleophobic properties with excellent adhesion to the substrate. The uniformity and flexibility of the coating layer was improved.

EXAMPLE 12

Atmospheric Plasma Treatment; Vapor Deposition; Electromagnetic-Field Exposure; Electron-Beam Curing; Plasma Post-Treatment
Substrate material: PET film run at line speed of 200 ft/min
1. Atmospheric Plasma Treatment with Vapor Deposition. An atmospheric glow discharge was produced by feeding helium with 10% oxygen (by volume) at a total rate of 3000 sccm and an AC field operated at 5 KV and 20 KHz. Liquid fluoroacrylate monomer was evaporated at 200-250° C. and the vapor was injected separately from the plasma gas, at a rate of 200 sccm, in the vicinity of the plasma zone, as shown in FIG. 6.
2. Exposure to Electromagnetic Field. The deposited layer of precursor was exposed for approximately 2 seconds to an electromagnetic field produced by a pair of electrodes energized with an AC power supply operating at 5 KV and 20 KHz prior to curing.
3. Curing. The condensed vapor was exposed to an Electrocurtain (Energy Science, Inc.).
4. Plasma Post-Treatment. The cured coating was exposed to atmospheric plasma created with helium with 5% tetrafluoromethane (fed at a combined feed rate of 3000 sccm) and an AC plasma field operated at 5 KV and 20 KHz.

The resulting coated product exhibited hydrophobic and oleophobic properties with excellent adhesion to the substrate. The uniformity and flexibility of the coating layer was improved.

EXAMPLE 13

Atmospheric Plasma Treatment; Vapor Deposition; Electromagnetic-Field Exposure; Electron-Beam Curing; Plasma Post-Treatment
Substrate material: PET film run at line speed of 200 ft/min
1. Atmospheric Plasma Treatment with Vapor Deposition. An atmospheric glow discharge was produced by feeding helium at 3000 sccm and an AC field operated at 5 KV and 20 KHz. Liquid polyethyleneglycol monoacrylate was evaporated at 200-250° C. and the vapor was injected separately from the plasma gas, at a rate of 200 sccm, in the vicinity of the plasma zone, as shown in FIG. 6.
2. Exposure to Electromagnetic Field. The deposited layer of precursor was exposed for approximately 2 seconds to an electromagnetic field produced by a pair of electrodes energized with an AC power supply operating at 5 KV and 20 KHz prior to curing.
3. Curing. The condensed vapor was exposed to an Electrocurtain (Energy Science, Inc.).
4. Plasma Post-Treatment. The cured coating was exposed to atmospheric plasma created with helium with 5% acetylene (fed at a combined feed rate of 3000 sccm) and an AC plasma field operated at 5 KV and 20 KHz.

The resulting coated product exhibited hydrophilic and anti-fog properties with excellent adhesion to the substrate. The uniformity and flexibility of the coating layer was improved.

EXAMPLE 14

Atmospheric Plasma Treatment; Vapor Deposition; Electromagnetic-Field Exposure; Electron-Beam Curing; Plasma Post-Treatment
Substrate material: PET film run at line speed of 200 ft/min
1. Atmospheric Plasma Treatment with Vapor Deposition. An atmospheric glow discharge was produced by feeding helium at 3000 sccm and an AC field operated at 5 KV and 20 KHz. Liquid liquid acrolin and/or chlorinated acrylate was evaporated at 200-250° C. and the vapor was injected separately from the plasma gas, at a rate of 200 sccm, in the vicinity of the plasma zone, as shown in FIG. 6.
2. Exposure to Electromagnetic Field. The deposited layer of precursor was exposed for approximately 2 seconds to an electromagnetic field produced by a pair of electrodes energized with an AC power supply operating at 5 KV and 20 KHz prior to curing.
3. Curing. The condensed vapor was exposed to an Electrocurtain (Energy Science, Inc.).
4. Plasma Post-Treatment. The cured coating was exposed to atmospheric plasma created with helium with 5% acetylene (fed at a combined feed rate of 3000 sccm) and an AC plasma field operated at 5 KV and 20 KHz.

The resulting coated product exhibited biocide, anti-bacterial properties with excellent adhesion to the substrate. The uniformity and flexibility of the coating layer was improved.

Figure 7:
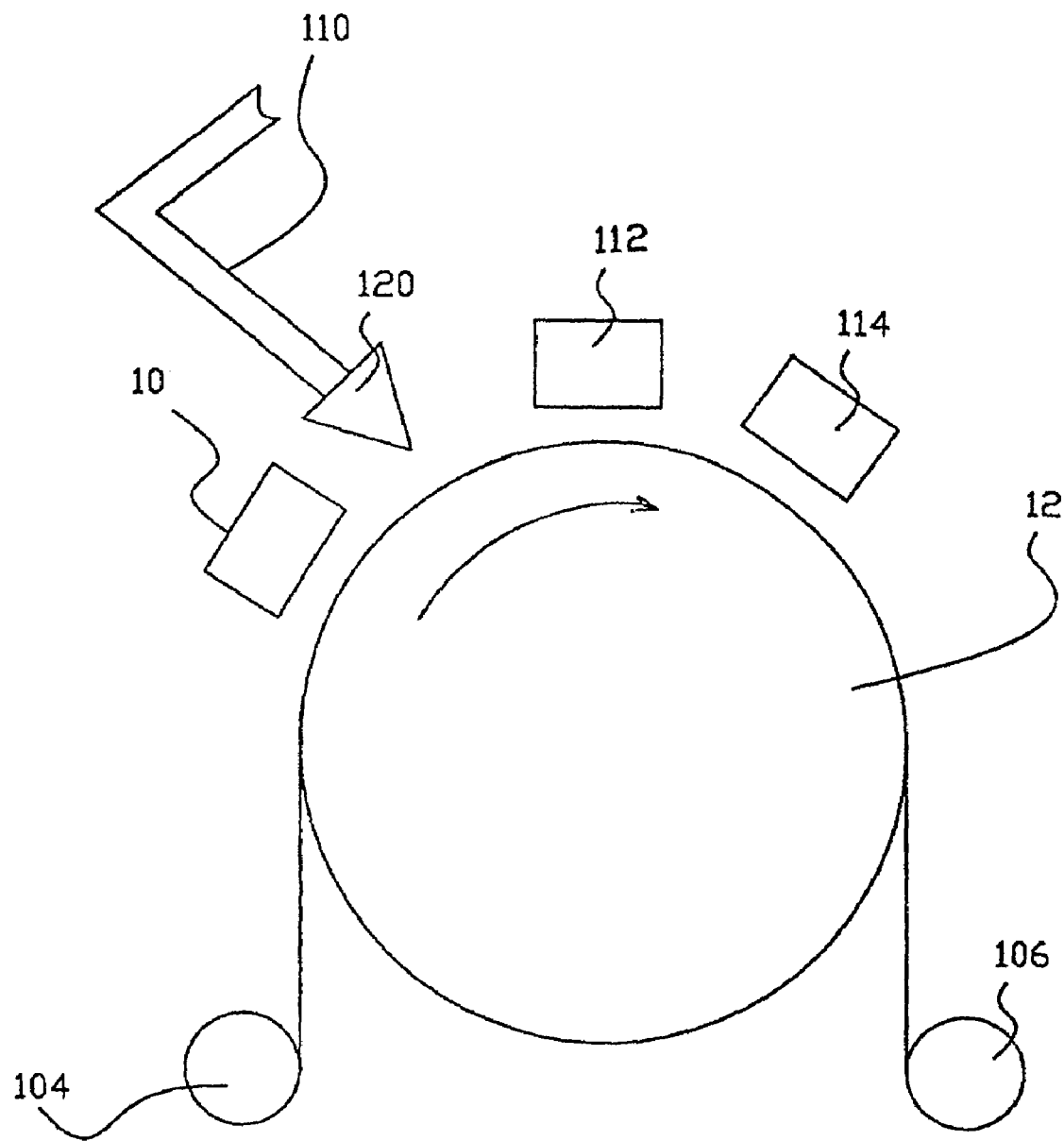
FIG. 7 is a schematic representation of an atmospheric deposition system as illustrated in FIG. 6, wherein a liquid precursor is atomized and deposited by spraying it over the moving substrate.

A similar set of tests was also performed using a liquid atomizer, as illustrated schematically in FIG. 7, rather than an atmospheric vapor deposition system. In all cases, the deposited layer of precursor was exposed for approximately 2 seconds to an electromagnetic field produced by a pair of electrodes energized with an AC power supply operating at 5 KV and 20 KHz prior to curing. The results were similar to the ones achieved in Examples 1-14, with improved coating uniformity and flexibility. The photoinitiators were mixed and atomized with the liquid precursors and, after deposition, they were exposed to the electromagnetic field and cured using the same various treatment steps illustrated above. Examples 15-16 below are typical of the conditions used and the results obtained.

EXAMPLE 15

Atmospheric Plasma Treatment; Atomized Spray Deposition; Electromagnetic-Field Exposure; UV-Light Curing The conditions were the same as in Example 2, except that the liquid fluoroacrylate monomer was sprayed on the plasma-treated substrate in mist form via an ultrasonic atomizer (Model 03960 by Sono-Tek Corporation of Milton, N.Y.). The resulting coated product exhibited hydrophobic and oleophobic properties with excellent adhesion to the substrate, essentially the same as the results obtained in Example 2. As in the case of the vaporized precursors, the uniformity and flexibility of the coating layer was improved.

EXAMPLE 16

Atmospheric Plasma Treatment; Atomized Spray Deposition; Electromagnetic-Field Exposure; Electron-Beam Curing; Plasma Post-Treatment The conditions were the same as in Example 11, except that the liquid fluoroacrylate monomer was sprayed on the plasma-treated substrate in mist form via the same ultrasonic atomizer of Example 15 and exposed to the electromagnetic field prior to curing, as detailed above. The resulting coated product exhibited comparable hydrophobic, oleophobic and adhesion properties, but improved coating uniformity and flexibility.

These results show that the additional step of exposing the uncured precursor layer to an electromagnetic field further enhances the final quality of the coating. The surface modification advantages described in the related patent applications remain undiminished. In addition, the invention provides a way to coat opposite sides of a porous material in a single pass, which is greatly beneficial for efficient and low-cost manufactures.

It is anticipated that a large variety of other polymerizable compounds can be used as precursors for this invention. They include the following:

1. Unsaturated alcohols and esters thereof: allyl, methallyl, 1-choroallyl, 2-chloroallyl, vinyl, methylvinyl, 1-phenalallyl, and butenyl alcohols; and esters of such alcohols with saturated acids such as acetic, propionic, and butyric; with unsaturated acids such as acrylic, α-substituted acrylic (including alkylacrylic, such as methacrylic, ethylacrylic, propylacrylic, etc.; and arylacrylic, such as phenylacrylic), crotonic, oleic, linoeic and linolenic; and with polybasic acids, such as oxalic, and malonic.

2. Unsaturated acids (as listed above for example); and esters thereof with lower saturated alcohols, such as methyl, ethyl propyl, isopropyl, butyl, isobutyl, sec-butyl, tert-butyl, 2-ethylhexyl, and cyclohexyl alcohols; and with saturated lower polyhydric alcohols, such as ethylene glycol, propylene glycol, tetramethylene glycol, neopentyl glycol, and trimethylopropane.

3. Unsaturated lower polyhydric alcohols, such as butenediol; and esters thereof with saturated and unsaturated aliphatic and aromatic, monobasic and polybasic acids, such as illustrated above.

4. Esters of the above-described unsaturated acids, especially acrylic and methacrylic acids, with higher molecular-weight monohydroxy and polyhydroxy materials, such as decyl alcohol, isodecyl alcohol, oleyl alcohol, and stearyl alcohol.

5. Vinyl cyclic compounds including styrene, o-, m-, p-chlorostyrenes, bromostyrenes, fluorostyrens, methylstyrenes, ethylstyrenes, cyanostyrenes; di-, tri-, and tetrachlorostyrenes, bromostyrenes, fluorostyrenes, methylstyrenes, ethylstyrenes, cyanostyrenes, vinylnaphthalene, vinylcyclohexane, divinylbenzene, trivinylbenzene; allybenzene, and heterocycles such as vinylfuran, vinnylpridine, vinylbenzofuran, N-vinylcarbazole, N-vinylpyrrolidone, and N-vinyloxazolidone.

6. Unsaturated ethers, such as methyl vinyl ether, ethyl vinyl ether, cyclohexyl vinyl ether, octyl vinyl ether, diallyl ether, ethyl methallyl ether, and allyl ethyl ether.

7. Unsaturated ketones, such as methyl vinyl ketone and ethyl vinyl ketone.

8. Unsaturated amides, such as acrylamide, methacrylamide, N-methylacrylamide, N-phenylolacrylamide, N-allylacrylamide, N-methylolacrylamide, N-allylcaprolactam, diacetone acrylamide, and 2-acrylamido-2-methylpropane-sulfonic acid.

9. Unsaturated aliphatic hydrocarbons, such as ethylene, acetylene, propylene, butanes, butadiene, isoprene, and 2-chlorobutadiene.

10. Unsaturated alky halides, such as vinyl fluoride, vinyl chloride, vinyl bromide, nylidene bromide, allyl chloride, and ally bromide.

11. Unsaturated acid anhydrides, such as maleic, citraconic, itaconic, cis-4-cyclohexene-1,2-dicarboxylic, and bicyclo(2.2.1)-5-heptene-2,3-dicarboxylic anhydrides.

12. Unsaturated acid halides, such as cinnamyl acrykyl, methacrylyl, crontonyl, oleyl, and fumaryl chlorides or bromides.

13. Unsaturated nitriles, such as acrylonitriles, methacrylonitrile, and other substituted acrylonitriles.

It is noted that the time of exposure of the uncured precursor layer to an electromagnetic field according to the invention is limited only by the speed of the web during the in-line operation. Thus, longer times than disclosed would be acceptable, though any practical effect would be exhausted after the first few seconds. Similarly, the curing step has been described as carried out immediately after exposure to the electromagnetic field only because of the practical necessity imposed by continuous in-line operation. Otherwise, a reasonable delay would not affect the result.

Various changes in the details, steps and components that have been described may be made by those skilled in the art within the principles and scope of the invention herein illustrated and defined in the appended claims. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

The invention claimed is:

1. A method for manufacturing a coated substrate by an in-line process of plasma treatment and precursor deposition at substantially atmospheric pressure, comprising the following steps:
    providing a first electrode and a second electrode separated by a dielectric material and facing a process space;
    applying a voltage across the electrodes;
    diffusing a plasma gas into the process space at substantially atmospheric pressure to pre-treat the substrate;
    depositing a precursor over said substrate at substantially atmospheric pressure;
    exposing said precursor deposited over the substrate to an electromagnetic field; and
    curing the precursor to produce a polymeric film.

2. The method of claim 1, wherein said electromagnetic field is produced by an AC power source.

3. The method of claim 1, wherein said electromagnetic field is produced by a DC power source.

4. The method of claim 1, wherein said electromagnetic field is produced by a plasma treater.

5. The method of claim 1, wherein said curing step is carried out with ultraviolet radiation.

6. The method of claim 1, wherein said curing step is carried out with visible light.

7. The method of claim 1, wherein said curing step is carried out with infrared radiation.

8. The method of claim 1, wherein said curing step is carried out electron-beam radiation.

9. The method of claim 1, wherein said depositing step is carried out by vaporizing and injecting said precursor over the substrate in a continuous in-line operation at atmospheric pressure.

10. The method of claim 1, wherein said depositing step is carried out by atomizing and spraying said precursor over the substrate in a continuous in-line operation at atmospheric pressure.

11. The method of claim 1, further including the step of post-treating the polymeric film in a plasma field after the step of curing the precursor.

12. The method of claim 1, wherein said depositing step is carried out by injecting said precursor over the substrate in a continuous in-line operation at atmospheric pressure, said electromagnetic field is produced by an AC power source, and said curing step is carried out by UV radiation.

13. The method of claim 12, further including the step of post-treating the polymeric film in a plasma field after the step of curing the precursor.

14. The method of claim 1, wherein said depositing step is carried out by atomizing and spraying said precursor over the substrate in a continuous in-line operation at atmospheric pressure, said electromagnetic field is produced by an AC power source, and said curing step is carried out electron-beam radiation.

15. The method of claim 14, further including the step of post-treating the polymeric film in a plasma field after the step of curing the precursor.

* * * * *